United States Patent [19]

Blum et al.

[11] Patent Number: 5,532,446
[45] Date of Patent: Jul. 2, 1996

[54] MAGNETIC DEFLECTION SYSTEM FOR A HIGH-POWER ELECTRON BEAM

[75] Inventors: Matthias Blum, Alzenau; Josef Heimerl, Linsengericht; Martin Bahr, Nidderau; Volker Bauer, Neuberg, all of Germany

[73] Assignee: Leybold Durferrit, Köln, Germany

[21] Appl. No.: 31,370

[22] Filed: Mar. 15, 1993

[30] Foreign Application Priority Data

Mar. 14, 1992 [DE] Germany ............... 42 08 484.9

[51] Int. Cl.⁶ .................................................. B23K 15/00
[52] U.S. Cl. ............................. 219/121.25; 219/121.16; 219/121.24; 373/14
[58] Field of Search ........................ 219/121.11, 121.12, 219/121.16, 121.25, 121.26, 121.27, 121.28, 121.3, 121.34, 121.29; 373/14; 335/210–214; 313/440; 445/64

[56] References Cited

U.S. PATENT DOCUMENTS

| | | | |
|---|---|---|---|
| 3,118,050 | 1/1964 | Hetherington | 219/121.25 |
| 3,219,435 | 11/1965 | Gruber et al. | 373/14 |
| 3,622,927 | 11/1971 | Washburn | 335/213 |
| 4,145,597 | 3/1979 | Yasuda | 219/121.26 |
| 4,158,122 | 6/1979 | Podola et al. | 219/121.25 |
| 4,160,150 | 7/1979 | Konig | 219/121.25 |
| 4,200,851 | 4/1980 | Nieuwendijk et al. | 335/210 |
| 4,369,418 | 1/1983 | Archer | 335/211 |
| 4,484,166 | 11/1984 | Osinga et al. | 335/213 |
| 4,638,142 | 1/1987 | Puisais et al. | 219/121.25 |
| 4,639,703 | 1/1987 | Metcalfe | 335/213 |
| 4,789,806 | 12/1988 | Meershoek | 335/211 |
| 4,794,300 | 12/1988 | Beelaard et al. | 313/440 |
| 4,798,552 | 1/1989 | Yasuda | 445/64 |
| 4,825,033 | 4/1989 | Beasley | 219/121.25 |
| 4,874,983 | 10/1989 | Slayterman | 313/440 |
| 4,988,844 | 1/1991 | Dietrich et al. | 219/121.17 |

FOREIGN PATENT DOCUMENTS

| | | |
|---|---|---|
| 0473097A2 | 3/1992 | European Pat. Off. . |
| 3513546A1 | 10/1986 | Germany . |
| 3145606C2 | 11/1986 | Germany . |
| 3532888C2 | 6/1990 | Germany . |

OTHER PUBLICATIONS

"Farbfernsehtechnik", by B. Morgenstern, pp. 58–61, 1977.
"Fernsehempfangstechnik", by Peter Zastrow, p. 146, 1978.

*Primary Examiner*—Tu Hoang
*Attorney, Agent, or Firm*—Lowe, Price, LeBlanc & Becker

[57] ABSTRACT

A magnetic deflection system for a high-power electron beam with an expanding cross-section area is used for melting or vaporizing metallic materials. Saddle coils are provided which open in a direction of expansion of the electron beam. With the aid of these saddle coils large deflection speeds of the electron beam are obtained with small imaging errors and large deflection angles.

12 Claims, 6 Drawing Sheets

MAGNETIC DEFLECTION SYSTEM FOR A HIGH-POWER ELECTRON BEAM

FIELD OF THE INVENTION

The invention relates to a system for deflecting an electron beam, and more particularly to a system for deflecting an electron beam of expanding cross-section that is suitable for melting and or vaporizing a metallic material.

BACKGROUND OF THE PRIOR ART

In electron beam melting installations and in electron beam vaporization installations the problem is encountered that electron beams with relatively large cross-sectional areas must remain bundled over a relatively great distance. Imaging errors here have a significantly stronger effect than for example in television tubes in which relatively short distances are overcome with a very thin electron beam. Moreover, in melting and vaporization installations high vapor deposition rates occur whereby the inner walls of deflection units are very quickly covered with, most frequently, a metallic process material. In the hereby ongrowing metal layers, eddy currents occur if they are penetrated by a magnetic deflection field which is variable in time. These eddy current losses increase with the area permeated by the field, which necessitates a deflection system of minimum possible size.

An electron beam melting installation is already known per U.S. Pat. No. 4,988,844, in which a cylindrical metal ingot is disposed above a tub and its lower end is melted off by two electron beams. However, in this patent there is not shown how the deflection of the electron beams is specifically carried out.

The same is true for another installation comprising a single electron beam capable of being deflected (German Patent No. 35 32 888).

Further it is known to treat material in a vaporization crucible by means of an electron beam which can be deflected by magnet coils (German published patent application No. 35 13 546), with deflection coils that are ring-shaped and include a cylindrical deflection channel.

In another known arrangement for generating metal ingots by means of electron beams a cylindrical metal ingot is melted off at its lower end of two obliquely incident electron beams (U.S. Pat. No. 3,219,435). The regulation of the electron beams takes place through focusing devices, a mechanical diaphragm, and a deflection coil, and the deflection coil is implemented in the form of a circular arc.

In television applications, thick-neck tubes with saddle coils are used for the realization of 110° deflection of electron beams (B.Morgenstein, Farbfernsehtechnik, 1977, p. 58 to 60; P. Zastrow, Fernsehempfangstechnik, 1978, p. 146). Focusing in the case of such tubes most often takes place magnetically.

In general, torodal coils are used for vertical deflection while horizontal deflection coils are implemented as saddle coils with relatively large coil length.

Such deflection systems, however, are not suitable for high-power electron beams because they are only capable of deflecting precisely thin electron beams close to the axis, but not electron beams with large cross-sectional areas.

Further, an electron scan microscope is known, in which an electron beam is bundled and deflected to a sample (German Patent No. 31 45 606). Upper and lower deflection coils are provided, the lower deflection coil being saddle-shaped. However, the deflection coils cannot be used for deflecting high-power electron beams having extensive cross-sectional areas.

Finally, a magnetic scanning system is known wherein ions are deflected (European published patent application No. 0 473 097). However, the coils used with this system are ring-shaped.

SUMMARY OF THE DISCLOSURE

It is a principal object of the present invention to provide a system for deflecting high-power electron beams with relatively large cross-sectional area with which it is possible to deflect at the same or nearly the same angle beams that are remote as well as those that are close to an axis.

This and other related objects are realized by providing a system for controlled magnetic deflection of a high-power electron beam having an expanding cross-sectional area, suitable for melting or vaporization of preferably metallic materials, comprising a rotationally symmetrical yoke of predetermined shape with an inner jacket surface and an outer jacket surface, wherein a distance "d" to the inner jacket surface from an axis of symmetry of the yoke increases in a predetermined direction, and a saddle coil having a shape corresponding to the shape of the rotationally symmetrical yoke.

The advantage achieved with the invention comprises in particular that too high a thermal load, due to edge electron beams deflected too far, is avoided of the container in which is disposed the melted-off material. Moreover, the shadowing of the electron beam at large deflection angles by the deflection system itself is largely avoided. The demands on the deflection system, contradictory per se for a large deflection system and low eddy current losses through vapor-deposited layers, are also met by the invention.

BRIEF DESCRIPTION OF THE DRAWING

An embodiment example of the invention is depicted in the drawing and will be described in greater detail in the following.

DETAILED DESCRIPTION OF THE PREFERRED EMBODIMENTS

Figure 1A:
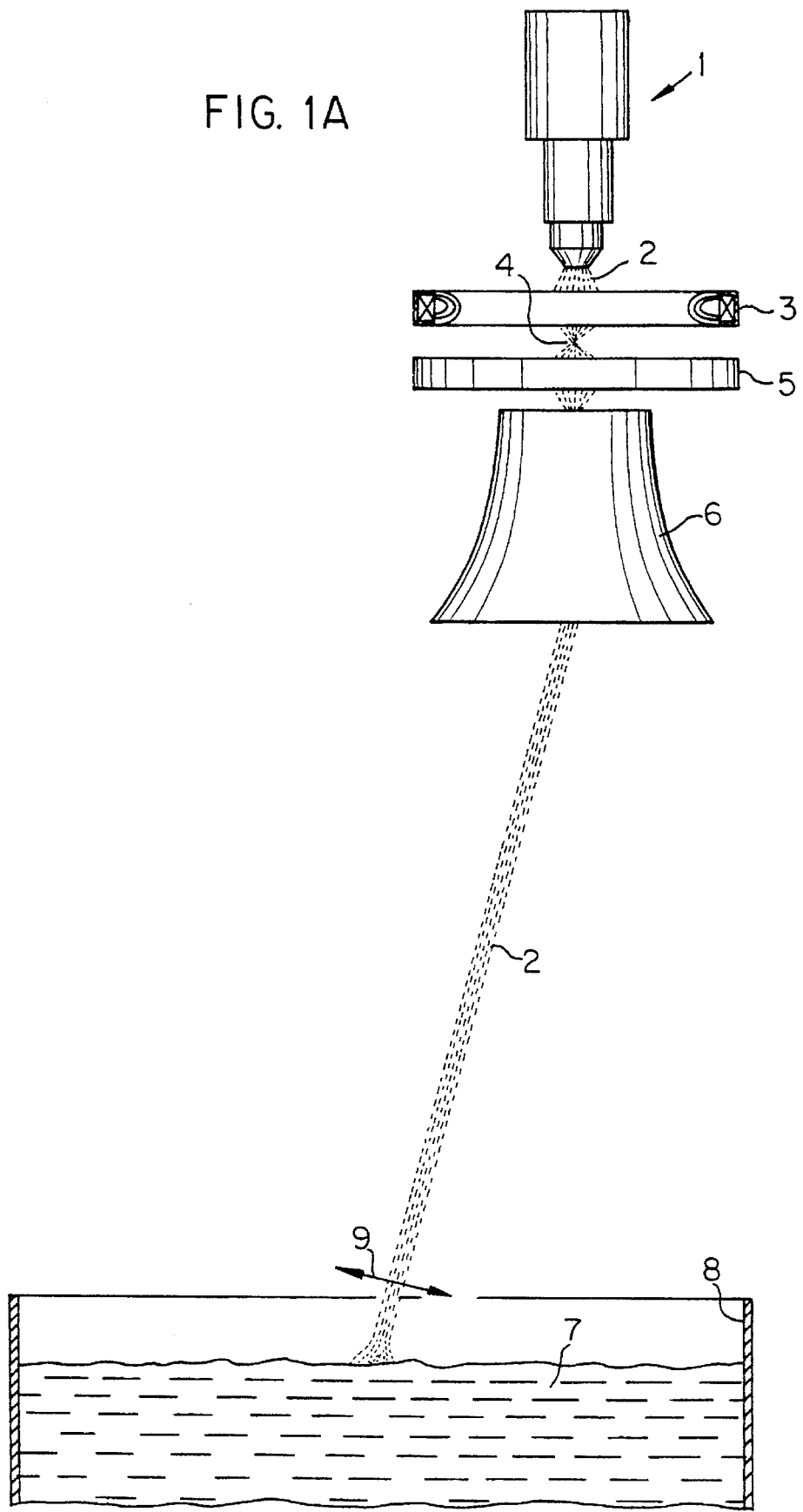
FIGS. 1A and 1B are schematic representations of an electron melting installation with saddle coil depicting different operating conditions in use.

In FIG. 1 is depicted an electron beam gun 1 which supplied an electron beam 2 with a relatively large cross-section. The acceleration voltage of this gun is, for example, 30 to 40 kV. The electron beam 2 expands with increasing distance from the electron beam gun 1 so that it is focused with the aid of a magnetic lens which comprises a magnet coil 3 in the form of a circular ring shown in section in FIG.

1. After the focusing at point 4 the electron beam expands again, whereupon it is concentrated by a further magnet coil 5 in the form of a circular ring (not shown in section) comprising a magnetic lens, and is guided to the interior of a saddle coil 6. Instead of two coils 3, 5, one coil is often sufficient for the concentration.

After the electron beam 2 has passed through the saddle coil 6, it impinges onto the surface of a material 7 that is to be vaporized or to be melted, the material being disposed in a container 8. The task of the saddle coil 6 is to deflect the electron beam 2 as is indicated by a double-headed arrow 9, best seen in FIG. 1. The deflection can then take place along two coordinates when two saddle coils are used. See FIG. 6. The geometry of the magnetic field applied by the saddle coils is selected so as to avoid/minimize any defocusing or image distortion of the electron beam.

A highly precise deflection or motion of the electron beam on the surface is required in order to achieve a precise energy distribution over the material surface. This is of great significance in melting superalloys and the like. Only through a precise energy distribution and consequently a high focusing quality connected with a rapid motion of the electron beam can a high solidification quality of the melt be achieved.

Figure 5:
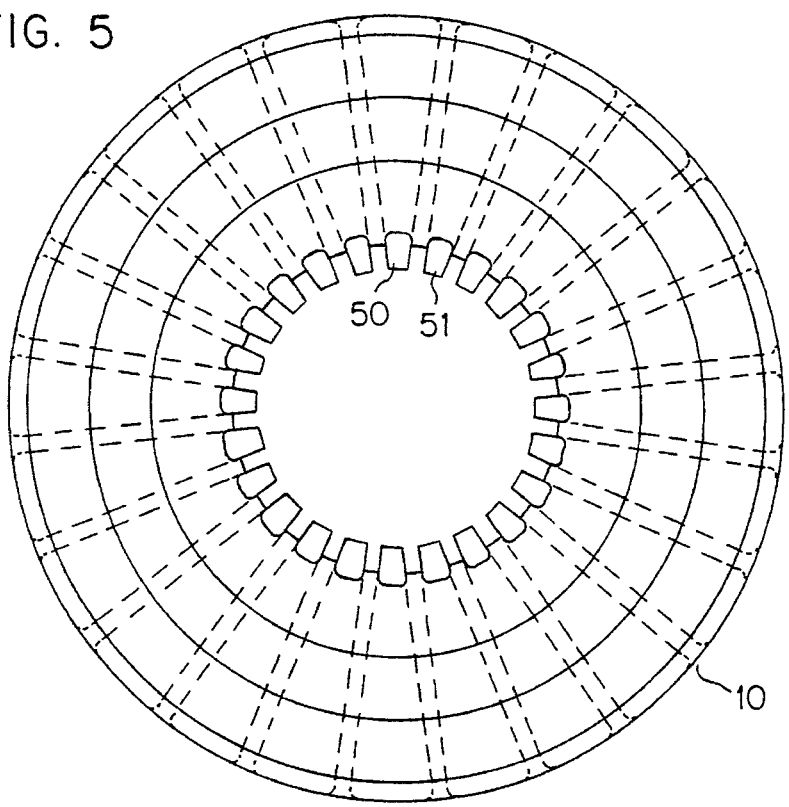
FIG. 5 is a view from above onto the yoke with a saddle coil.
Figure 6:
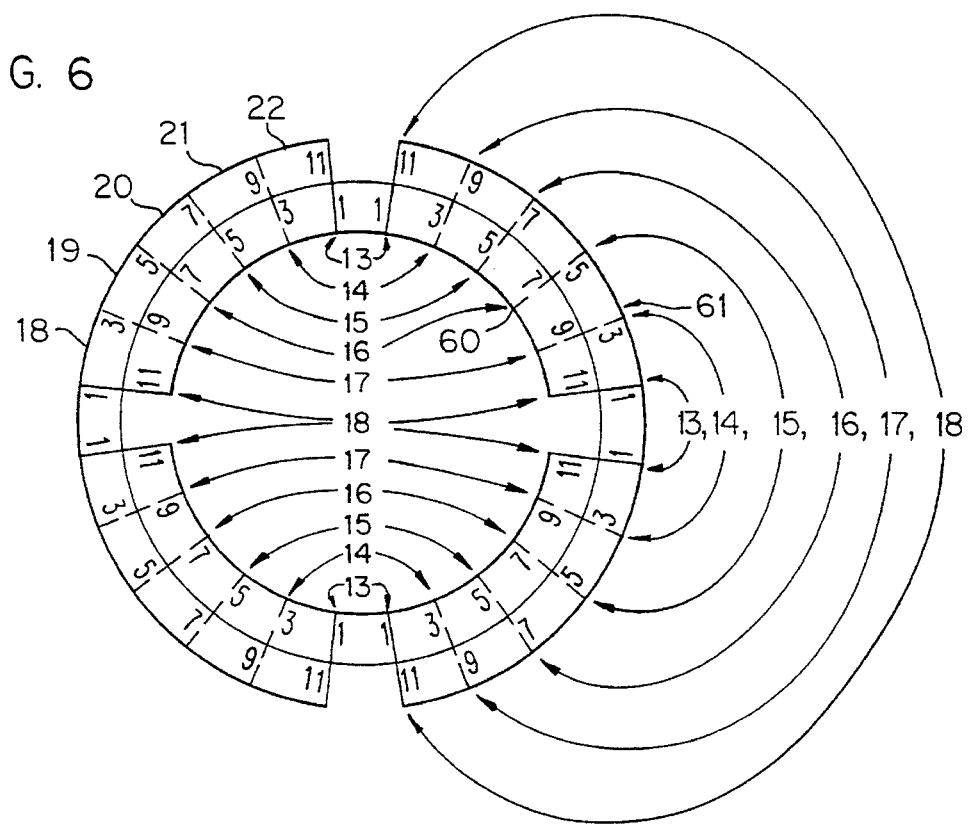
FIG. 6 is a schematic representation of the winding system for two saddle coils used for deflection in two directions.

The object of the saddle coils is merely the deflection of the beam of electrons. The illustrated field geometry (see FIG. 6) avoids defocussing of the electron beam. There are two saddle coils arranged which will deflect the beam of electrons to the x or y direction (cf. FIG. 2). A single pair of saddle coils is shown in FIG. 3. The saddle coils as such are wound as shown in FIGS. 5 and 6. The special filament wound coil (which is in principle also used in TV technology) generates a very homogeneous magnetic field in the inner space of the deflection unit, thereby minimizing defocusing. The field lines are too complicated to be clearly shown in the drawing, since they stem from a three-dimensional problem. A place-dependent three-dimensional magnetic vector having three components is generated within the saddle coils. The magnetic field distribution, however, is exactly defined through the number and position of the coils and through the description of the yoke by means of the equation provided below.

If wide foils are to be coated by means of electron beam vaporization of the selected material, the container 8 is a long and narrow crucible which must be scanned with the electron beam 2 along its entire length, i.e., a large deflection angle is required while simultaneously the diameter of the electron beam must be kept constant over its entire length. High coating rates, in addition, require very large deflection frequencies.

Figure 1B:
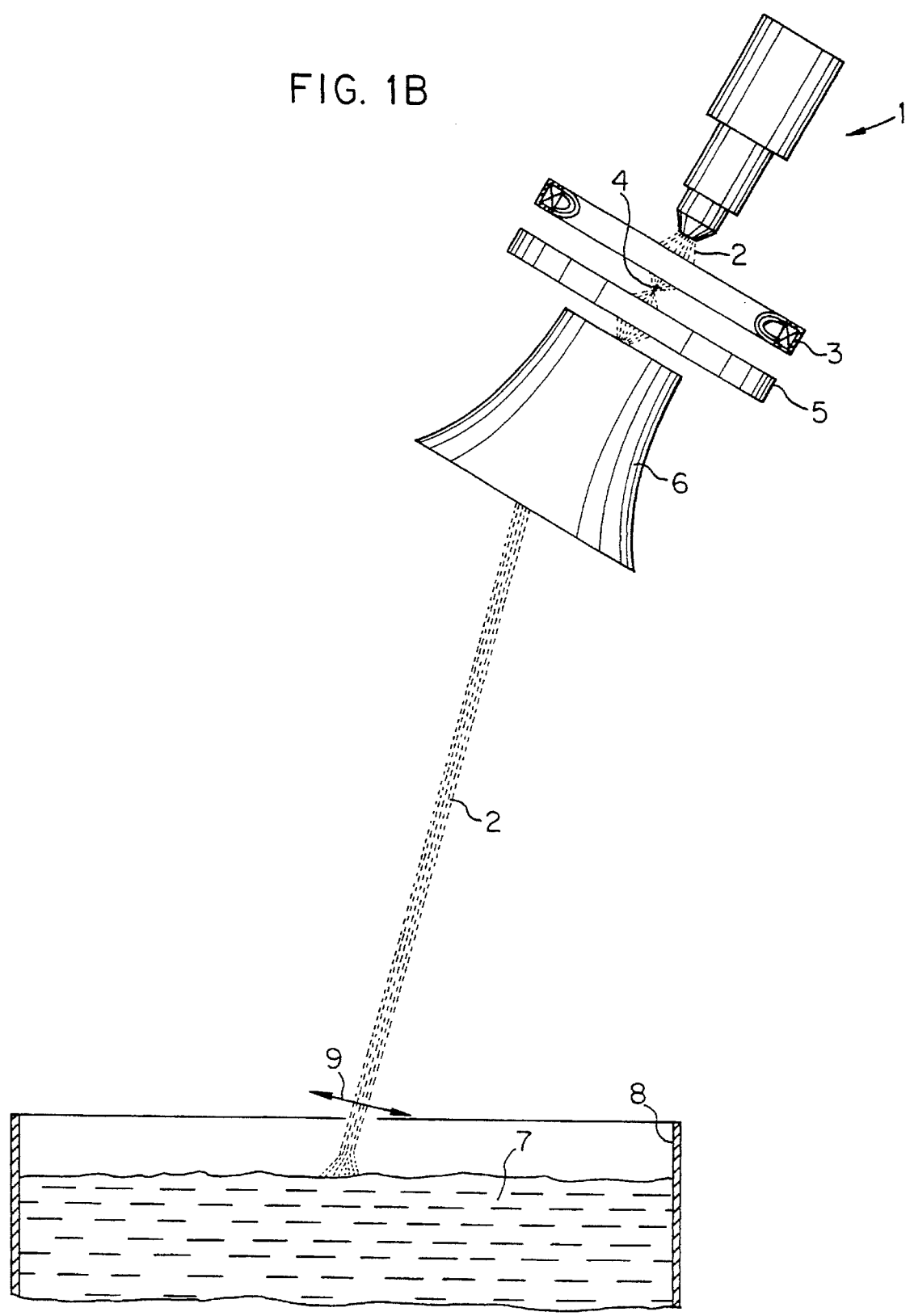

When vaporizing and melting materials by means of electron beams the beam tube is often arranged in a tilted or shifted way with respect to the surface of the crucible in order to prevent a direct inner vapor deposition the beam tube. This means that normally the crucible is not arranged directly beneath the beam, but in a sideways shifted or tilted manner with respect thereto. A static pre-deflection of the electron beam is necessary in these cases. This is best seen in FIGS. 1A and 1B.

Figure 2:
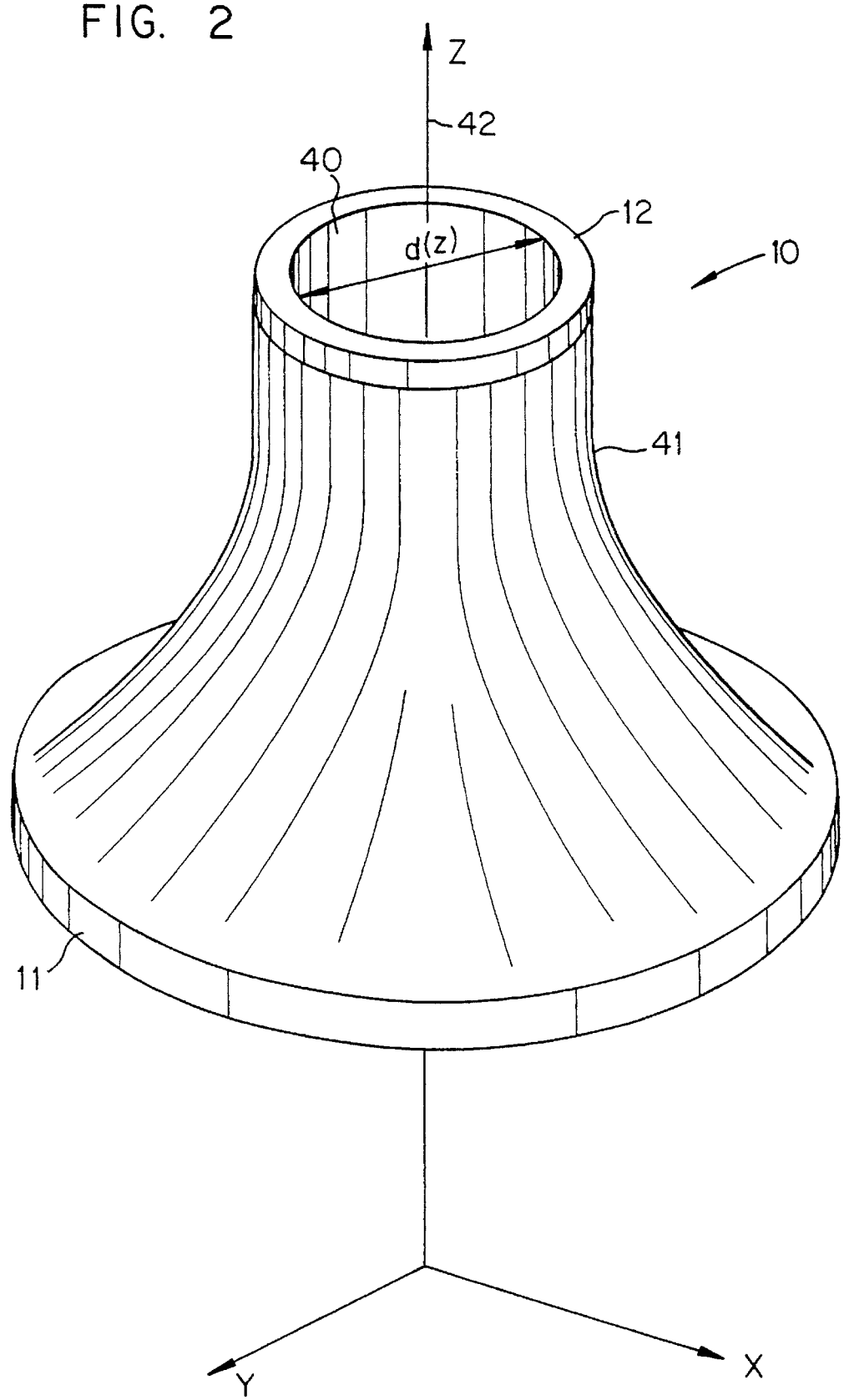
FIG. 2 illustrates a yoke in the form of a hyperbola for a saddle coil.
Figure 3:
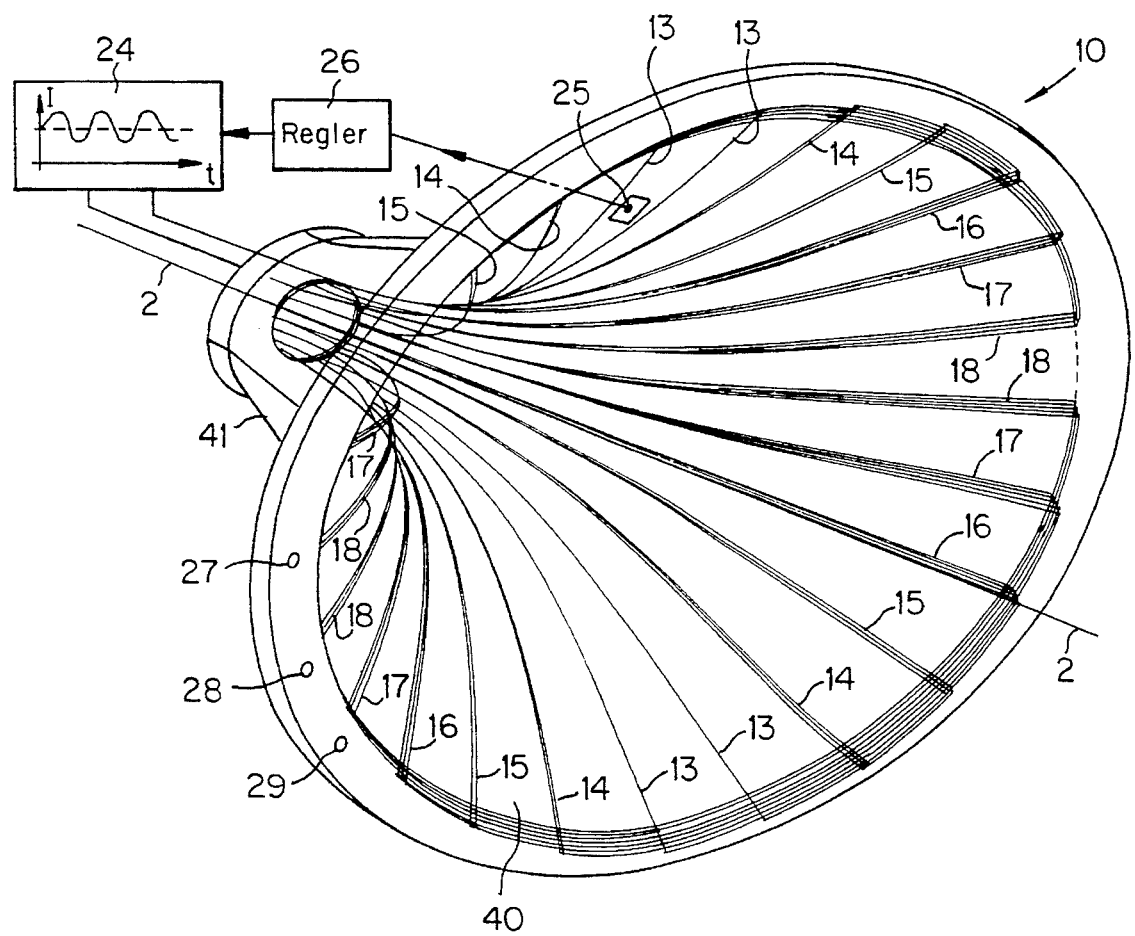
FIG. 3 shows a yoke provided with a saddle coil.

In FIG. 2 is depicted a yoke 10 which can serve as carrier for a saddle coil. This yoke 10 comprises for example soft iron, ferrite or another suitable material and has a profile approximately in the shape of a hyperbola. The lower circumference 11 is greater than the upper circumference 12. The inner diameter d of yoke 10 as a function of the z-axis is calculated according to the formula:

$$d(z) = y_o + \frac{m}{2} * \left[ z_w * \ln \left\{ 2\cosh\left(\frac{z-z_o}{z_w}\right) \right\} + (z-z_o) \right]$$

$y_o$, $m$, $z_o$, and $z_w$ are parameters which can be varied. These parameters are a function of the beam power, and consequently the minimum diameter, the maximum required deflection angle, and the targeted focus quality. For example, $y_o$: measure of the inlet opening (0 cm<$y_o$<20 cm)

m: measure of the maximum outlet angle $\alpha$; m=tan $\alpha$ (0°<$\alpha$<90°);

$z_w$: measure of the degree of curvature (0 cm<$z_w$<50 cm) i.e., the width of the area within which the yoke has a curvature; and $z_o$: position of the center of curvature (−40 cm<$z_o$<40 cm).

In FIG. 3 the yoke 10 of FIG. 2 is depicted in perspective view, together with overlapping saddle coils comprising several phase windings, of which phase windings 13 to 18 are shown. A current supply 24, to which the saddle coil is connected, supplies an a.c. voltage U of a frequency in the range 1 Hz to 10 kHz onto which a dc voltage is superimposed. The dc voltage enables the generation of a constant deflection of the electron beam 2, in order to impinge it, for example, onto the surface of melt material in a crucible. But since the electron beam 2 in addition is also to be moved back and forth on the surface of the crucible, an a.c. current component is required.

The amplitude of the voltage U applied at the saddle coils 13 to 18 is influenced by an active field regulation. A magnetic field sensor 25 is introduced in the deflection unit and provides a signal to a regulator 26 which signal corresponds to a sensed measured instantaneous magnetic field strength. The regulator compares this measured value with a predetermined nominal value and regulates the current supply 24 up or down accordingly.

In order to protect the deflection system depicted in FIG. 3 against thermal overload, cooling pipes are set into the yoke 10 of which only three exemplary cooling pipes 27 to 30 are shown. FIG. 3 shows only the coil configuration for one direction of deflection. For a deflection shifted by 90° a corresponding coil configuration is present at the same yoke 10 spatially shifted by 90°. See FIG. 6 for such a schematic depiction of saddle coils to obtain such a deflection. The windings are arranged in recesses which are provided for both configurations of coils. These recesses are shown in the yoke of FIG. 5. A number of leads are provided corresponding to the chosen number of coils. 40 denotes the inner surface of the yoke while its outer surface is denoted by 41.

In FIG. 3 one pair of coils is depicted which is necessary for deflecting the electron beam in one direction. In order to simplify the drawing, the second pair of coils which is necessary for the deflection in the direction perpendicular to the first direction is not shown. The pair of coils consists of two identically wound opposite coil packages. The windings of these coil packages are adapted to the yoke geometry whereby, according to FIG. 6, the coils are distributed on the circumference. Hereby the number of windings depends on the position on the circumference: The, coils having the largest inner surface 18 comprise the greatest number of windings, typically eleven windings. The number of windings decreases in accordance with the decrease of the inner surface (coil 17 has 9, coil 16 has 7, coil 15 has 5, coil 14 has 3 windings and coil 13 has one winding only). In FIG. 3 this fact is shown by the number of lines of the respective coils.

Figure 4:
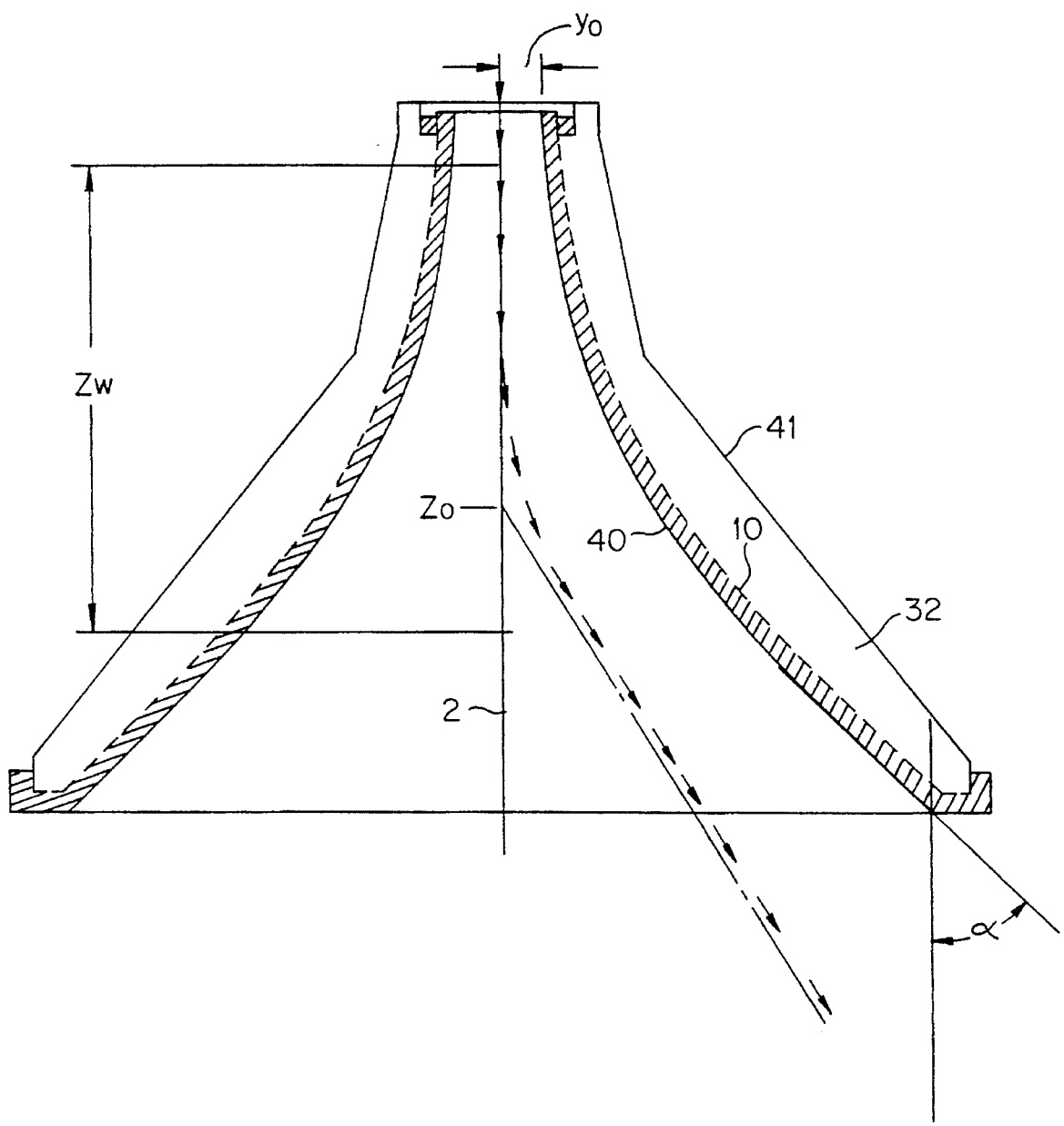
FIG. 4 is a longitudinal sectional view through a yoke with a saddle coil.

In FIG. 4 is depicted a section through yoke 10 with the saddle coils. The saddle coils, of which winding 13 is denoted in detail, are herein set into a mass 32 disposed around the yoke 10. Again, the inner and the outer surfaces 40, 41 as well as electron beam 2 are evident. A deflected disposition of the electron beam is schematically represented by the line 2' of short arrows.

FIG. 5 shows a view from above onto the yoke 10 with the saddle coils, i.e., it is a top view of FIG. 4. Herein the different windings of the saddle coils can herein be seen of which only five are provided with reference numbers 18 to 22. These windings are guided between teeth, of which only two teeth are denoted by the reference numbers 50 and 51.

In FIG. 6 is depicted the winding scheme of the saddle coils 13 to 18. The numbers entered here denote the winding numbers of the coils or windings. The inner circular ring 60 comprises, for example, the coils for the x-deflection while the outer circular ring 61 comprises the coils for the y-deflection.

In this disclosure, there are shown and described only the preferred embodiments of the invention, but, as aforementioned, it is to be understood that the invention is capable of use in various other combinations and environments and is capable of changes or modifications within the scope of the inventive concept as expressed herein.

We claim:

1. A system for controlled magnetic deflection of an electron beam having an expanding cross-sectional area for melting or vaporizing of material in a crucible, comprising:

a rotationally symmetrical yoke of predetermined shape with an inner jacket surface and an outer jacket surface, wherein a distance from an axis of symmetry of the yoke to the inner jacket surface, d(z)/2, increases in a predetermined direction; and a saddle coil wound on the yoke having a shape corresponding to the shape of the rotationally symmetrical yoke for deflecting said electron beam within said crucible, whereby said electron beam is deflected by a magnetic field generated in said saddle coil to traverse a surface of said material.

2. A system for controlled magnetic deflection of an electron beam having an expanding cross-sectional area for melting or vaporizing of material in a crucible, comprising:

a rotationally symmetrical yoke of predetermined shape with an inner jacket surface and an outer jacket surface, wherein a distance from an axis of symmetry of the yoke to the inner jacket surface, d(z)/2, increases in a predetermined direction; and a saddle coil wound on the yoke having a shape corresponding to the shape of the rotationally symmetrical yoke for deflecting said electron beam within said crucible, said yoke inner jacket surface diameter d(z) is determined as a function of a longitudinal distance "z" measured along the axis of symmetry according to the equation:

$$d(z) = Y_o + \frac{m}{2} * \left[ z_w * \ln \left\{ 2 \cosh \left( \frac{z - z_o}{z_w} \right) \right\} + (z - z_o) \right]$$

wherein $Y_o$, $m$, $z_o$, and $z_w$ respectively correspond to a measure of a yoke inlet opening, the tangent of a measure of maximum outlet angle, an axial position of a center of curvature and a measure of the degree of curvature, whereby said electronic beam is deflected by a magnetic field generated in said saddle coil to traverse a surface of said material.

3. The magnetic deflection system according to claim 1, wherein:

the yoke with a saddle coil is disposed above a material to be worked by means of an electron beam propagated through the yoke and saddle coil toward said material.

4. The magnetic deflection system according to claim 1, further comprising:

an electron beam gun for generating said electron beam; and two magnetic lenses provided between the electron beam gun and the yoke cooperatingly disposed with the saddle coil.

5. The magnetic deflection system according to claim 1, wherein:

said saddle coil comprises a plurality of cooperating coils having respective numbers of winding coils and disposed circumferentially of said yoke.

6. The magnetic deflection system according to claim 1, further comprising:

a current supply regulated by a regulator for supplying a regulated current to said saddle coil; and a magnetic field sensor for sensing a magnetic field strength in the yoke and providing a signal corresponding to a sensed instantaneous value of magnetic field strength to said regulator.

7. The magnetic deflection system according to claim 6, wherein:

the current supply provided an output at a predetermined dc voltage on which is superimposed an ac voltage.

8. The magnetic deflection system according to claim 7, wherein:

the frequency of the ac voltage lies between 1 hz and 10 kHz.

9. The magnetic deflection system according to claim 1, wherein:

the yoke comprises soft iron.

10. The magnetic deflection system according to claim 2, wherein:

a yoke with a cooperating saddle coil is disposed above a material to be worked by means of an electron beam propagated through the yoke and saddle coil toward said material.

11. The magnetic deflection system according to claim 3, further comprising:

an electron beam gun for generating said electron beam; and two magnetic lenses provided between the electron beam gun and the yoke cooperatingly disposed with the saddle coil.

12. A system for controlled magnetic deflection of an electron beam having an expanding cross-sectional area for melting or vaporizing of material in a crucible, comprising:

a rotationally symmetrical yoke of predetermined shape with an inner jacket surface and an outer jacket surface, wherein a distance from an axis of symmetry of the yoke to the inner jacket surface, d(z)/2, increases in a predetermined direction;

a saddle coil wound on the yoke having a shape corresponding to the shape of the rotationally symmetrical yoke for deflecting said electron beam within said crucible, an election beam gun for generating said electron beam; and two magnetic lenses provided between the electron beam gun and the yoke cooperatingly disposed with the saddle coil, whereby said electronic beam is deflected by a magnetic field generated in said saddle coil to traverse a surface of said material.

* * * * *